United States Patent [19]  [11] Patent Number: 4,649,316
Cleaver et al.  [45] Date of Patent: Mar. 10, 1987

[54] ION BEAM SPECIES FILTER AND BLANKER

[75] Inventors: John R. A. Cleaver; Haroon Ahmed, both of Cambridge, England

[73] Assignee: Dubilier Scientific Limited, Abingdon, England

[21] Appl. No.: 533,493

[22] Filed: Sep. 19, 1983

[30] Foreign Application Priority Data

Sep. 17, 1982 [GB] United Kingdom ............... 8226636

[51] Int. Cl.$^4$ ............................................. H01J 49/20
[52] U.S. Cl. .................... 313/361.1; 313/153; 250/281; 250/423 R
[58] Field of Search ............... 313/360.1, 361.1, 363.1, 313/153, 154, 156, 161; 315/111.81, 111.91; 250/423 R, 424, 427, 298, 294, 281

[56] References Cited

U.S. PATENT DOCUMENTS 3,293,490 12/1966 MacKenzie ............... 315/111.81
3,375,452 3/1968 Forsyth .................. 313/363.1 X
3,617,739 11/1971 Liebl ..................... 250/49.5 P
3,649,862 3/1972 Wahlin ................... 313/361.1
4,047,030 9/1977 Lobach ................... 250/423 R X
4,124,801 11/1978 Cook et al. ............... 250/423 R X

FOREIGN PATENT DOCUMENTS

WO81/03239 11/1981 Japan .

OTHER PUBLICATIONS

H. Liebl, "Ion Optics of Ion Microprobe Instruments", Vacuum, vol. 33, pp. 525-531, 1983.
"A Mass-Separating Focused-Ion-Beam System for Maskless Ion Implantation", V. Wang et al., Hughes Research Laboratories, Dec. 1981, pp. 1158-1163.

Primary Examiner—David K. Moore
Assistant Examiner—K. Wieder
Attorney, Agent, or Firm—Wenderoth, Lind & Ponack

[57] ABSTRACT

A system for incorporation in ion-beam equipment to provide ion species filtering and optional ion beam blanking. The system has four magnets arranged on an optical axis. In between the two center magnets is arranged a plate having an off-axis aperture. The ion beam is caused to converge to a focus on a midplane in which the aforesaid plate is situated. When the magnets are energized, the ion beam is caused to bend by an amount depending upon the charge-to-mass ratio of the ion species within the beam. If constructed correctly, the aperture can thus be arranged to pass only a single ion species, the remainder colliding with and being absorbed by the plate. Beam blanking may optionally be achieved by blanking plates which may be used to deflect the ion beam in such a way that the resultant focal point of the ion beam is displaced away from the aperture so that the whole ion beam is blanked off. Astigmatism introduced into the system may be reduced or eliminated by the use of octopole electrode sets.

8 Claims, 9 Drawing Figures

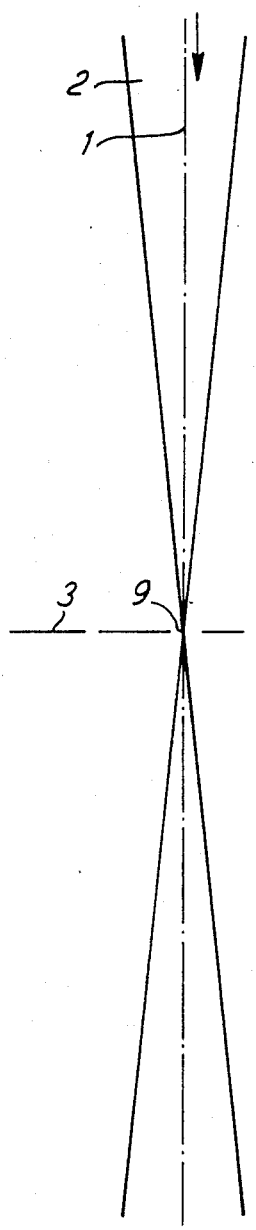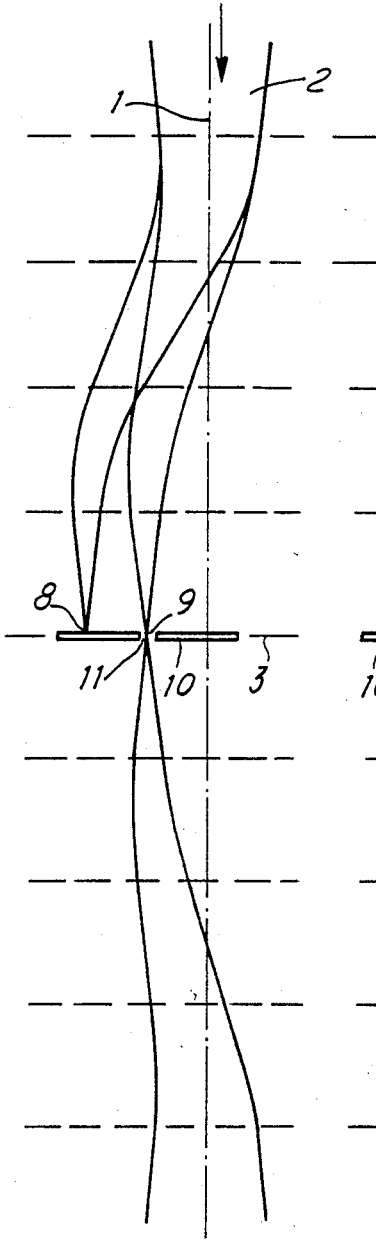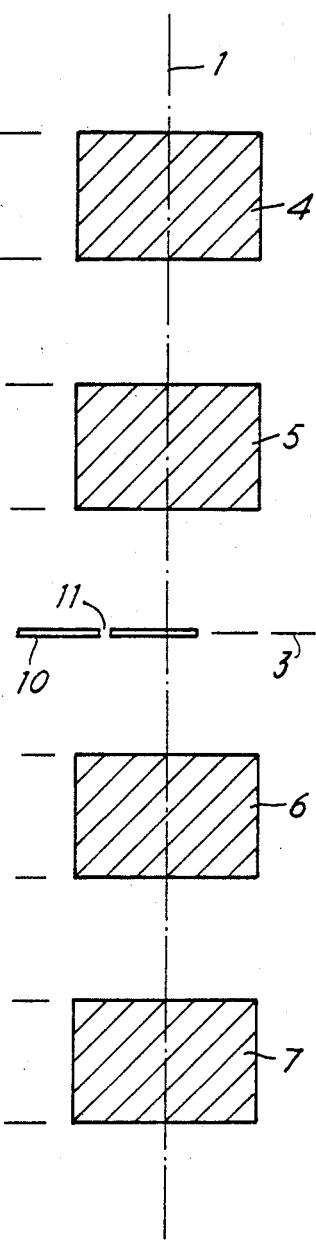

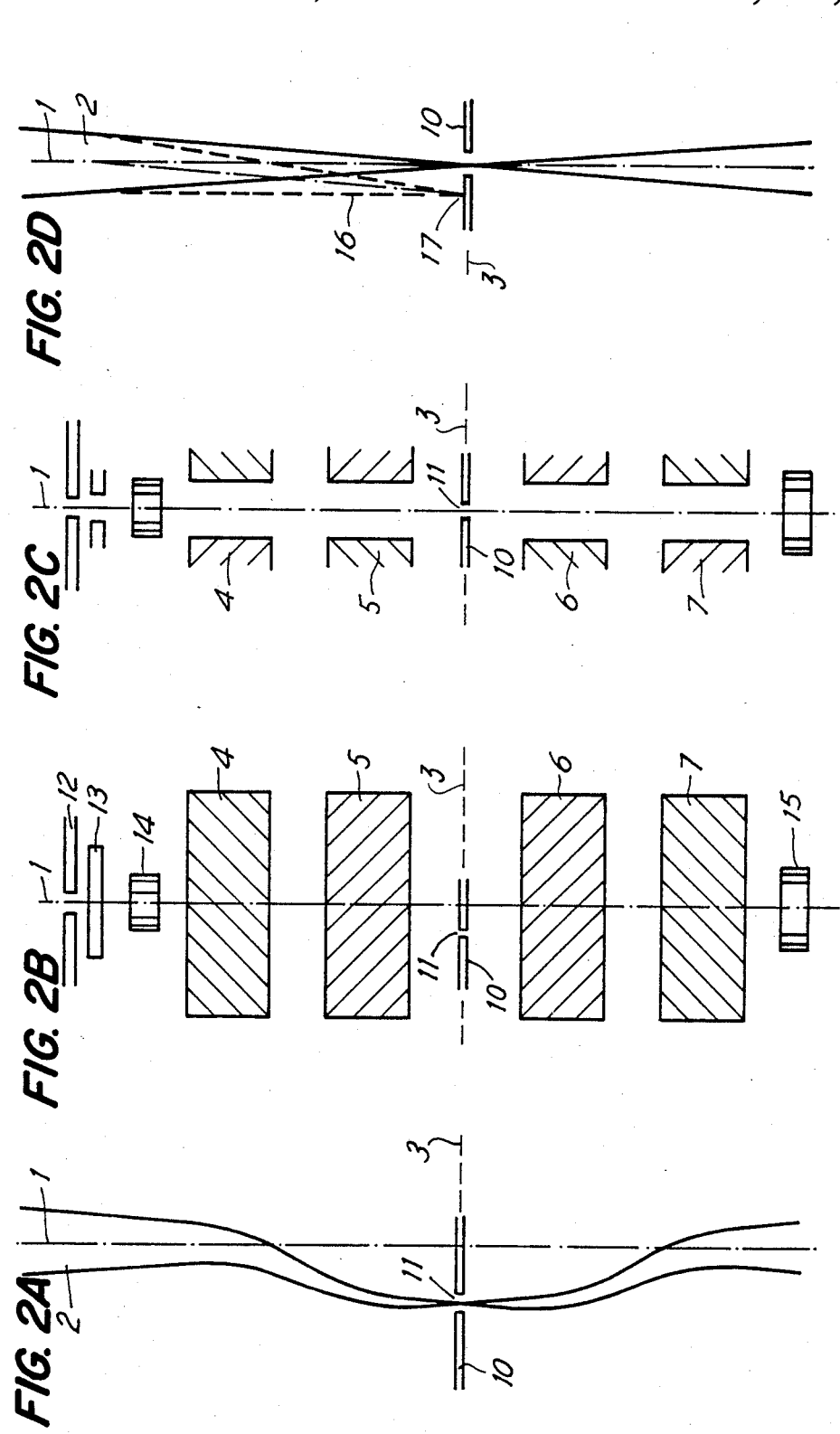

FIG. 3A
FIG. 3B
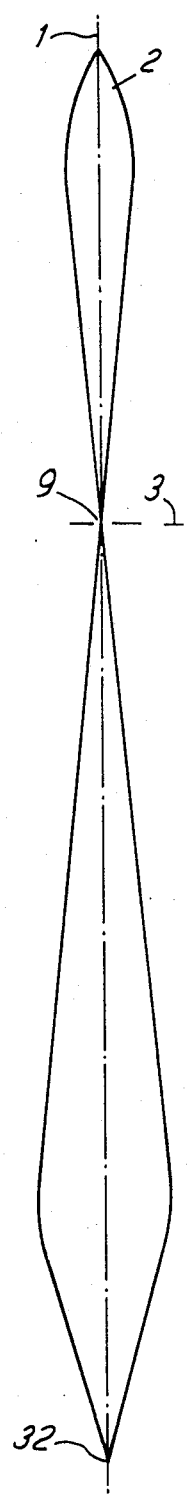
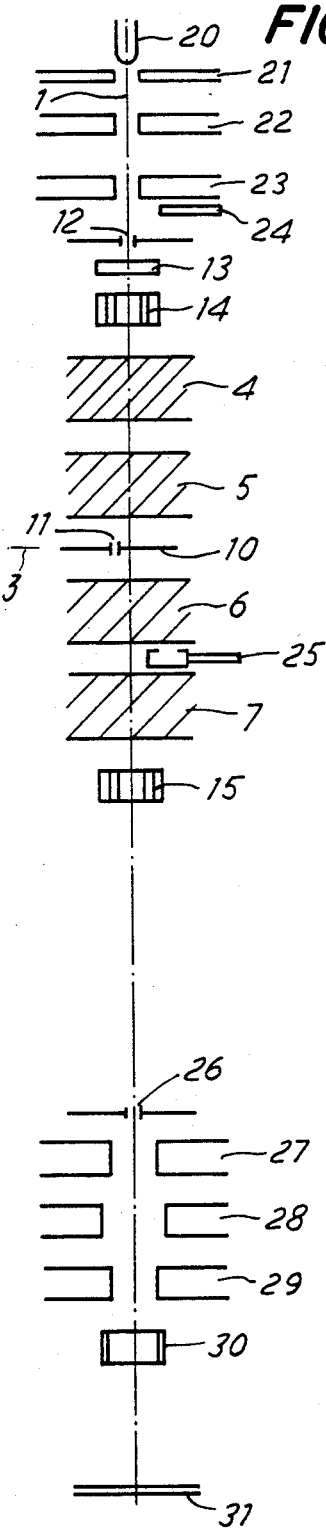

ION BEAM SPECIES FILTER AND BLANKER

BACKGROUND OF THE INVENTION

This invention relates to ion-beam apparatus and in particular to a system for incorporation in ion-beam equipment to provide ion species selection and optional beam blanking. The invention has particular, although not exclusive, application in the manufacture of microelectronic devices, both for the production of masks and for operations on substrates for the direct production of devices and microcircuits.

The ion sources commonly used in ion-beam equipment may produce a variety of ion species. If the source contains only a single element, then there may be ions with multiple charges and ions with more than one atom; if more than a single element is present in the source, then ions of more than one element may be present in the beam. For many applications in the microfabrication of electronic devices and circuits, and in image formation and surface analysis, it is necessary to use ion beams containing only a single ion species. It is also necessary to provide a means for blanking the ion beam, for turning it off abruptly so that it ceases to impinge on the target.

For lithography applications, the ion beam may be used for resist exposure, for semiconductor doping, and for micromachining. In all these applications it is necessary to select the ion species with the desired penetration characteristics into the target, and to exclude those with other penetration characteristics and those which could contaminate the target. If the beam is to be used for doping, the requirement is for the selection of the electrically active species, whilst for resist exposure and for micromachining it is necessary to select the species with the desired penetration characteristics. In any application it is necessary to exclude ion species with different penetration characteristics and species that may contaminate the target. It is therefore appropriate to consider the design of filters for ion beam lithography instruments.

The ion species selection and beam blanking system of the invention may be employed with a variety of types of ion source. However, it is intended primarily for use with liquid or gaseous field-ionization sources, since they yield a small and intense source of ions which is particularly suitable for equipment in which a finely focused ion probe is required. In such sources, ions are produced by means of a high electric field acting at the apex of a sharply pointed needle in a gaseous environment (see Muller E. W. and Tsong S. S. 1969 "Field ion Microscopy", Elsevier, New York; or Hanson G. R. and Siegel B. M. 1979 J. Vac. Sci. Technol. 16 1875–1878) or wetted with a liquid-metal film (see Clampitt R., Aitken K. L. and Jefferies D. K. 1975 J. Vac. Sci. Technol. 12, 1208 or Prewett P. D., Jefferies D. K. and Cockhill T. D. 1981 Rev. Sci. Instrum. 52, 562–566), or at the apex of a capillary tube containing the liquid to be ionized (see Mahoney J. F. et al 1969 J. Appl. Phys. 40, 5101–5106). In the case of the liquid-metal field-ionization sources, the liquid may be either a pure metal or an alloy.

One known type of system which has been adopted for ion beam apparatus (see Wang, V. et al J. Vac. Sci. Technol. 19 1158) is the Wien filter, in which an ion beam passes through superimposed electric and magnetic fields which are nominally perpendicular and proportional. Provided the fields are accurately matched, the electrical axis of the filter is straight; however, there is no means for eliminating neutral atoms or droplets. In order to produce the matched, superimposed fields, it is necessary to have relatively large gaps between the magnet pole pieces (to accommodate the electrodes) and between the electrodes (to accommodate the pole pieces). Thus the fields are inevitably fairly weak, whilst requiring high magnetic excitations and voltages. This is acceptable for the apparatus described by Wang V. et al 1981 J. Vac. Sci. Technol. 19 1158, since the filter is introduced into a low voltage section of the column rather than at the full beam voltage of 150 kV. A further limitation is that the filter would be dispersive with respect to energy distribution within a single ion species.

SUMMARY OF THE INVENTION

The present invention proposes a fully magnetic filter, with a high degree of symmetry, in order to overcome these problems.

In accordance with the invention there is provided ion beam apparatus having an ion-optical system comprising deflection means for deflecting an incident ion beam by an amount dependent on the ion species, and an aperture through which one or more selected species of ion within said ion beam may pass to thereby eliminate unwanted species from the beam.

In order to blank the ion beam, said deflection means may be energized sufficiently to deflect the beam in such a way as to completely miss the aperture, the beam thus being cut off. In a preferred embodiment, however, a further separate deflection means are used for this purpose, this latter technique enabling a deflection means having a very short ion transit time to be used, this resulting in very fast beam blanking.

Preferably the first-mentioned deflecting means takes the form of at least one magnet, preferably an electromagnet, whose pole pieces are positioned in such a way as to deflect the beam by an amount dictated by the charge-to-mass ratio of individual ions within the beam. In this way, individual ion species within the beam are separated, and may be selected using said aperture, as noted above. Using this technique, it is also possible to eliminate neutral atoms and high-mass, weakly-charged clusters and droplets.

It will be noted that, if a deflecting means in the form of only a single magnet (or equivalent) is used, then the ion beam emergent from the aperture will be at an angle to the incident ion beam. This is clearly inconvenient, and the preferred form of the invention contemplates the use of still further deflecting means whereby the emergent beam is at least parallel to, and preferably coaxial with, the incident beam. Optical aberrations which occur as a result of the beam passing through the system can be reduced to a minimum using techniques to be described herein and/or using conventional techniques described in the literature—see for example Enge H. A. (1967) "Focusing of Charged Particles" (ed A. Septier) 2, 203–264, Academic Press, New York.

In order to obtain maximum sensitivity in the selection of required ion species, it is preferred that the incident beam is caused to converge to a crossover point, the aperture being positioned in a plane containing this crossover point. In this way, the minimum size of aperture can be used. In this connection, note that the aperture may take the form of a circular through-hole or a narrow slit. When the system is correctly constructed and adjusted the diameter of the beam at the plane of the crossover point that contains ions of any particular species is typically of the order of one micrometer in diameter. The beam can thus pass readily through an aperture of 5 μm or 10 μm in diameter. Such an aperture would provide ample selectivity for the selection of ion species produced by a liquid-metal field-ionization source.

BRIEF DESCRIPTION OF THE DRAWINGS

In order that the invention may be better understood, an embodiment thereof will now be described by way of example only and with reference to the accompanying drawings in which:

FIGS. 1A-1C show general arrangement of the optical system of the invention wherein FIG. 1A is a ray diagram with the magnetic fields turned off, FIG. 1B is a ray diagram with the magnetic fields turned on and FIG. 1C is a diagrammatic transverse section showing the components of the system;

FIGS. 2A-2D are drawings similar to that of FIGS. 1A-1C but additionally incorporating beam blanking wherein FIG. 2A is a ray diagram with the magnetic fields turned on;

FIGS. 2B and 2C are diagrammatic transverse sections showing the components of the system in respective mutually perpendicular planes and FIG. 2D corresponds to FIG. 2A, but taken in a vertical plane perpendicular thereto; and FIGS. 3A-3B show a general arangement of a probe-forming system incorporating the beam species selection and beam blanking features of the present invention wherein FIG. 3A is a ray diagram with the magnetic fields turned off and FIG. 3B is a diagrammatic transverse section showing the components of the system.

DESCRIPTION OF THE PREFERRED EMBODIMENT

Referring to FIGS. 1A-1C, the optical axis of the system is shown under reference 1. An incident ion-beam 2 (typically 100 μm in diameter) enters the system along the axis and is brought to a focus in a plane 3. The components of the optical system are shown in FIG. 1C and comprise four magnets 4-7 which have pole pieces positioned in such a way as to deflect the beam in the manner shown in FIG. 1B. The pole pieces of the magnets are symmetrically disposed about the plane 3 and are arranged so that the magnetic fields are perpendicular to the axis 1 of the system. The fields for the outer magnets 4 and 7 are parallel, while the fields for each of the inner magnets 5 and 6 are anti-parallel to the outer fields. The magnetic fields are of nominally equal strength and axial extent so that the ion beam, when it reaches the mid-plane 3, is laterally shifted without the introduction of any tilting by the action of the first and second magnets 4 and 5. The third and fourth magnets 6 and 7 have an equal and opposite effect so that, at least to the first order, there is no net effect on the beam as a result of its passage through the system. However, the radius of curvature of the ion trajectories within the magnetic fields is dependent upon their mass-to-charge ratio, and thus the focal points 8 and 9 for individual ion species within the beam are subject to different lateral displacements at the mid-plane 3.

Positioned in the mid-plane 3 is a screening plate 10 equipped with an off-axis aperture 11. The aperture 11 may be circular, or in the form of a narrow slit. If the aperture is sufficiently narrow then only ions of a single desired species will pass through, the remaining ions, for example those focused at point 8, being absorbed.

In a representative system, each of the four magnets 4-7 are of 25 mm axial extent with all entry and exit faces of the pole pieces flat and normal to the axis 1. The magnetic pole pieces gap surfaces are flat and parallel to the axis. The axial separation between the magnetic fields of magnets 4 and 5 and between magnets 6 and 7 is 20 mm. The separation between the field of magnet 5 and plane 3 and between plane 3 and magnet 6 is likewise 20 mm. The overall length of the magnet assembly is thus 180 mm. The radius of curvature of the beam axis within the magnetic fields is 1000 mm.

The displacement of the selector aperture 11 from the axis 1 is 812 μm. For a typical desired ion species, singly-charged arsenic at 150 keV, the necessary magnetic field would be 0.48T.

The resolution of the system would not need to be large; a relatively stringent requirement would be the separation of the mass 10 and mass 11 isotopes of boron. In the representative system these isotopes would be brough to a focus about 37 μm apart, and thus could readily be separated using an aperture 10 μm in diameter. The aperture diameter would probably be between 20 and 50 times larger than the diameter of the focused cross-over in its plane.

A consequence of the need for only low-filter resolution is that the increase in cross-over size due to energy spread within any ion species would not be large. A fractional energy spread of ±0.01% would produce a displacement in the aperture plane 3 of about ±0.11 μm, so that operation of the system would be unaffected. There would be no degradation of the diameter of the final ion probe at the target (not shown) since there would be no net lateral displacement through the filter because of the equal and opposite lateral displacements introduced by the first and second pairs of magnetic fields.

It will be seen that the system operates by shifting the ion beam laterally (in the plane of FIGS. 1A-1C) without the introduction of tilt by the first pair of of magnets 4 and 5 and then bringing it back to the original axis by the second pair of magnets 6 and 7. The field strengths and pole pieces dimensions for each of the four field regions must therefore be well matched. As mentioned above, the amount of lateral shift is dependent upon the mass-to-charge ratio of each ion species within the beam, and thus a circular or slit-like aperture may be used for species selection. Adequate resolution can in fact be achieved with quite small deflection (under 1000 μm), and initial calculations indicate that the focal properties and the aberrations of the filter should be sufficiently weak that the focal characteristics of the main optical system (not shown) would not be degraded significantly.

If the ion beam is brought to a focus at the plane 3, then the diameter of the beam at the cross-over would be less than 1 micron and an aperture of 5 μm or 10 μm in diameter (or width in the case of a slit aperture) would be appropriate for species selection. Because the plane of the the cross-over is fixed, a 2-lens arrangement with such a system would be fixed in its magnification, and the diameter of the ion probe (not shown) could be controlled only by choice of the objective lens aperture.

An additional lens could be added if it was essential to retain this degree of freedom.

FIGS. 2A–2D are similar to FIGS. 1A–1C, but incorporate the possibility of rapid beam blanking, and also contain components for correcting certain optical defects. Identical reference numerals to those of FIGS. 1A–1C are used where appropriate.

The system shown in FIG. 2B is similar to that shown in FIG. 1C with the addition of a gun exit aperture 12 which determines the beam angle at the focus and which is typically the exit aperture of the ion gun (not shown), a beam blanking plate 13 which will be referred to again hereinafter and electric octopole plate sets 14 and 15 which latter include within their functions the correction of asigmatism. FIG. 2C is a further view of the system on a plane passing through the axis 1, but turned through 90° with respect to the plane of FIG. 2B. FIG. 2C clearly shows the individual pole pieces of the magnets 4, 5, 6 and 7 and their relationship to the axis 1. Note also that, in FIG. 2C, the aperture 11 appears on the axis 1 of the system since the action of the magnets 4–7 is to deflect the beam only in the plane of FIG. 2B—at right angles to the plane of FIG. 2C.

The above described system contains all of the elements necessary for a fast and sensitive beam blanking system. Since the wanted component of the ion beam has been brought to a focus in the plane of a small aperture, it is only necessary to displace the beam in the aperture plane by a few tens of micrometers in order to cut the beam off completely. This is preferably achieved by deflection of the ion beam in a direction perpendicular to the direction of deflection due to the above-mentioned magnetic fields, this ensuring that there is no possibility of an unwanted ion species, normally cut off by the aperture, being allowed through when the blanking deflection signal is applied (although if there are only a few widely-separated ion species present, then the blanking and filtering deflection directions need not be perpendicular). The small amount of deflection necessary can be provided by a pair of plates 13 situated above the entrance to the system. If these plates are located immediately below the aperture 12 that limits the ion beam entering the filter then the separation of the plates can be made very small and the deflection sensitivity relatively high even for axially short plates. The advantage of making the plates short is that the transit time of the ions past them will be only a few nanoseconds, permitting very fast blanking using drive signals of only a few tens of volts in amplitude.

The operation of the blanking plates is illustrated in FIG. 2D which, it will be noted, is in the same plane as FIG. 2C, namely perpendicular to that of FIGS. 2A and 2B. The solid lines show the undeflected path of the ion beam whereas the dotted lines 16 show the deflected path of the ion beam which comes to a focus 17 on the plate 10 whence it is absorbed.

In the representative system, the gun exit aperture 12 is of the order of 100 μm in diameter and thus it will be practicable to place a pair of blanking plates 13 with 250 μm separation immediately beneath it. If these plates are 2.5 mm in axial extent it would be necessary to apply only about 10 V between them to deflect the ion beam about 20 micrometers at the plane 3, this deflection being about four times the typical radius of the aperture 11 which should be ample for fast blanking. It should be noted that additional precautions might be required to ensure that negligble numbers of ions are transmitted during prolonged blanking intervals. The transit time for an arsenic$^+$ ion, accelerated to 150 keV, past such plates would be about 4 ns.

The full implementation of a complete probe-forming instrument is illustrated in FIGS. 3A–3B to which reference will now be made.

Ions are emitted from a liquid-metal field-ionization source 20 as a result of the application of a high electric field predominantly controlled by an extractor electrode 21. The ions pass through a first accelerator electrode 22 which has a predominant effect on the focal properties of the gun and is therefore adjusted to bring the emergent ion beam 1 to a focus 9 in the plane 3. The beam is accelerated to its full energy by a second accelerator electrode 23. The electrodes 22 and 23 comprise a tetrode gun (see Cleaver, J. R. A. (1975) Int. J. Electron. 38, 513–529 or Cleaver, J. R. A. and Ahmed, H. (1981) J. Vac. Sci. Technol. 19, 1145–1148). A mechanical shutter 24 is provided to prevent system contamination during the initial adjustment of the gun.

The cross-section of the ion beam emergent from the tetrode gun is defined by the aperture 12 and immediately following this aperture the deflection plates 13 are situated, as before. An octopole electrode set 14 is provided for alignment and stigmation and for scanning the ion beam across the mass selection and blanking aperture 11 to facilitate focusing and alignment. The four magnets 4–7 are situated beyond the octopole electrode set 14. A collector 25 is provided for monitoring the current passing through the system; except during alignment, this collector is withdrawn from the beam. Beyond the final magnet 7 is a further octopole electrode set 15 for stigmation and alignment. Final limitation of the ion beam cross-section is by an aperture 26 situated in the vicinity of the final probe-forming lens. This latter is composed of two outer electrodes 27 and 29 at beam potential and a control electrode 28 whose potential can be varied to bring the ion beam to a focus 32 at the target 31. Electric deflection plates 30 are used to scan the ion beam for pattern generation. Because the cross-over point 9 is fixed in its axial position to coincide with the aperture 11, the overall magnification of the system is fixed. If this limitation is not appropriate, additional lenses (not shown) can be added.

There has been described an ion-optical system for incorporation in scanning ion beam lithography apparatus and in other instruments for which a finely focused ion beam is required, for applications such as ion beam microscopy and secondary ion mass spectroscopy. The function of the system is to filter ion species on the basis of charge-to-mass ratio, preferably without separation within individual ion species on the basis of any distribution in energy of the ion. The system should also eliminate neutral atoms and high-mass, weakly-charged clusters and droplets. The system should not significantly degrade the optical performance of the complete instrument or complicate its alignment unduly and, for these reasons and to facilitate the mechanical design and construction, its mechanical axis is straight. It is possible to turn the system off completely so that the apparatus can be operated in an unfiltered mode.

The delineation of patterns in ion beam lithography requires means both for deflecting the ion beam across the target and for turning it on and off abruptly. These functions can be performed under the control of a computer by suitable electronic circuits driving electric beam-deflection plates. In order that nominally unexposed parts of the target are not affected by the beam and that the ion exposure dose is correct throughout the nominally exposed parts, it is necessary to be able to turn the ion beam on or off in a time short in comparison with the time taken to expose the smallest resolvable part of the pattern. Thus the blanking system should be capable of operation in a small fraction of a microsecond; further, any resultant errors in beam position should decay rapidly. It is therefore desirable that a blanking system using electric deflection plates should have high sensitivity so that first, low voltage circuits can be used to drive them and so that the electrical connection between the drive circuits and the plates can be by transmission lines with matched terminations (without introducing excessive power dissipation in the matching resistors). The above described system enables such requirements to be realized.

Adequate dispersion can be achieved for quite small lateral displacements of the aperture 11, typically of the order of 500 μm and corresponding to trajectory radii in the magnetic fields of some hundreds of millimeters. With these small deflections, the first-order properties provide a good representation of the actual properties of the system, but some consideration of its aberrations is nevertheless desirable. The first half of the system—i.e. magnets 4 and 5—introduces some astigmatism which is doubled rather than cancelled by the second half, although for other aberrations cancellation will occur. Aberrations can be reduced by some of the conventional methods applicable to magnetic prisms—for example, the opposing faces of the magnetic pole-pieces may be made conical rather than parallel, so that the magnetic field strength varies with the distance from the center of curvature of the trajectory, whilst the entrance and the exit faces of the pole pieces may be tilted and curved. It has been found desirable to incorporate octopole stigmators 14,15 above and below the filter assembly so that, by application of suitable signals to the octopoles, they can also be used for static alignment and for scanning the ion beam. In particular, it is necessary to have provision for scanning the ion beam over the filter aperture so that (in conjunction with an electron detector below the aperture) the ion beam can be brought into a stigmatic focus there. In operation, the ion beam would first be aligned through the gun and the objective lens with the aperture fully withdrawn. The aperture 11 will then be set on the system axis and gun adjusted to bring the beam to a focus there, and finally the magnets would be excited, the analyzer aperture moved to the appropriate off-axis position and any adjustment of focus, aperture position and stigmatism correction undertaken so that the focused spot corresponding to the wanted ion species passed centrally through the aperture.

We claim:

1. An ion beam apparatus comprising: a generating means for generating an ion beam centered about an axis; a first and a second magnetic deflection means for deflecting said ion beam to a focal point displaced from said axis by an amount dependent upon the charge-to-mass ratio of the ions contained within said ion beam; a screening plate orientated in a lateral direction with respect to said axis, said screening plate having an off-axis aperture formed therein at a location wherein only ions within said ion beam which are of a predetermined selected ion species pass through said aperture and wherein ions of the remaining other ion species impinge on said plate and are absorbed by said plate; a third and a fourth magnetic deflection means arranged so as to have an equal and opposite effect to said first and second deflection means for deflecting said ion beam back to a position centered about said axis;

wherein the symmetrical effect of said apparatus causes the divergence of said ion beam due to energy spread to be reversed after passing through an aperture plane thereof such that when said ion beam emerges from said third and fourth deflection means, said ion beam is parallel in all respects, and wherein said ion beam apparatus separates ions on the basis of their charge-to-mass ratio without eliminating ions having the same charge-to-mass ratio but having different energy levels.

2. An ion beam apparatus as claimed in claim 1, wherein said first and second magnetic deflection means each comprise a pair of magnets which are situated in the path of said ion beam above said aperture and which together deflect said ion beam from said generating means into a path parallel to that of said beam from said generating means but spaced therefrom by an amount dependent upon the charge-to-mass ratio of said ions contained within said ion beam.

3. An ion beam apparatus as claimed in claim 2, wherein said third and fourth magnetic deflection means each comprise a pair of magnets respectively axially spaced along said ion beam and having mutually oppositely-directed magnetic fields to those of said first and second magnetic deflecting means respectively.

4. An ion beam apparatus as claimed in claim 1, including further deflection means for deflecting said ion beam such that no component of said ion beam passes through the aperture whereby said ion beam is blanked off.

5. An ion beam apparatus as claimed in claim 4, wherein said first deflection means comprises a pair of blanking plates which are upstream of said first magnetic deflection means and across which an electric field is set up for deflecting said ion beam for effecting blanking thereof.

6. An ion beam apparatus as claimed in claim 4, wherein said first deflection means deflects said ion beam away from its axis of incidence in a direction perpendicular to the direction of deflection caused by said first and second magnetic deflection means.

7. An ion beam apparatus as claimed in claim 1, wherein all of said magnets forming said first through fourth magnetic deflection means are identical electromagnets which are positioned symmetrically along the axis of said ion beam from said generating means about a plane perpendicular to said axis and passing through the focal plane thereof.

8. An ion beam apparatus as claimed in claim 5, wherein said further deflection means deflects said ion beam away from its axis of incidence in a direction perpendicular to the direction of deflection caused by said first and second magnetic deflection means.

* * * * *